(12) United States Patent
Botala et al.

(10) Patent No.: US 6,868,513 B1
(45) Date of Patent: Mar. 15, 2005

(54) AUTOMATED MULTI-DEVICE TEST PROCESS AND SYSTEM

(75) Inventors: Sally S. Botala, Colchester, VT (US); Dale B. Grosch, Burlington, VT (US); Donald L. LaCroix, Jericho, VT (US); Douglas E. Sprague, Jericho, VT (US); Randolph P. Steel, Essex Junction, VT (US); Anthony K. Stevens, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 09/697,364

(22) Filed: Oct. 26, 2000

(51) Int. Cl.[7] .................... G01R 31/28; G01R 27/28; G01R 31/00; G01R 31/14; G06F 11/00

(52) U.S. Cl. .................... 714/738; 702/118; 702/119; 702/123

(58) Field of Search ................. 714/724, 738, 714/742; 324/761, 765; 702/118, 119, 121, 123

(56) References Cited

U.S. PATENT DOCUMENTS

| | | | | |
|---|---|---|---|---|
| 4,888,715 A | * | 12/1989 | Tada et al. .................. 714/736 |
| 5,025,205 A | * | 6/1991 | Mydill et al. ............... 324/73.1 |
| 5,216,361 A | * | 6/1993 | Akar et al. .................. 324/761 |
| 5,216,673 A | * | 6/1993 | Kanai .......................... 714/719 |
| 6,331,770 B1 | * | 12/2001 | Sugamori ................ 324/158.1 |
| 6,363,504 B1 | * | 3/2002 | Rhodes et al. ............. 714/724 |
| 6,366,109 B1 | * | 4/2002 | Matsushita .................. 324/765 |
| 6,484,116 B1 | * | 11/2002 | Yokoyama ................... 702/119 |
| 6,499,121 B1 | * | 12/2002 | Roy et al. .................... 714/724 |
| 6,536,006 B1 | * | 3/2003 | Sugamori .................... 714/724 |
| 6,557,128 B1 | * | 4/2003 | Turnquist .................... 714/724 |
| 6,753,693 B2 | * | 6/2004 | Seo et al. .................... 324/765 |

OTHER PUBLICATIONS

Kuen–Jong Lee, Jih–Jeen Chen and Cheng–Hua Huang; Broadcasting test patterns to multiple circuits, IEEE Transactions on Computer–Aided Design of Integrated Circuits and Systems, vol: 18 Issue: 12, Dec. 1999, Page(s): 1793–1802 .*

* cited by examiner

Primary Examiner—Joseph D. Torres
(74) Attorney, Agent, or Firm—Richard M. Kotulak

(57) ABSTRACT

A method, system and software for automatically generating a test environment for testing a plurality of devices (DUTs) under test in a test system. The multiple devices are tested by mapping the plurality of DUTs into pins of the tester system to create pin data; inputting into a test program generator pattern data, generic test program rules and the pin data; generating a multi-DUT test program and multi-DUT pattern data; and controlling the test system through the test program. The resulting fail data is then logged to each DUT.

12 Claims, 1 Drawing Sheet

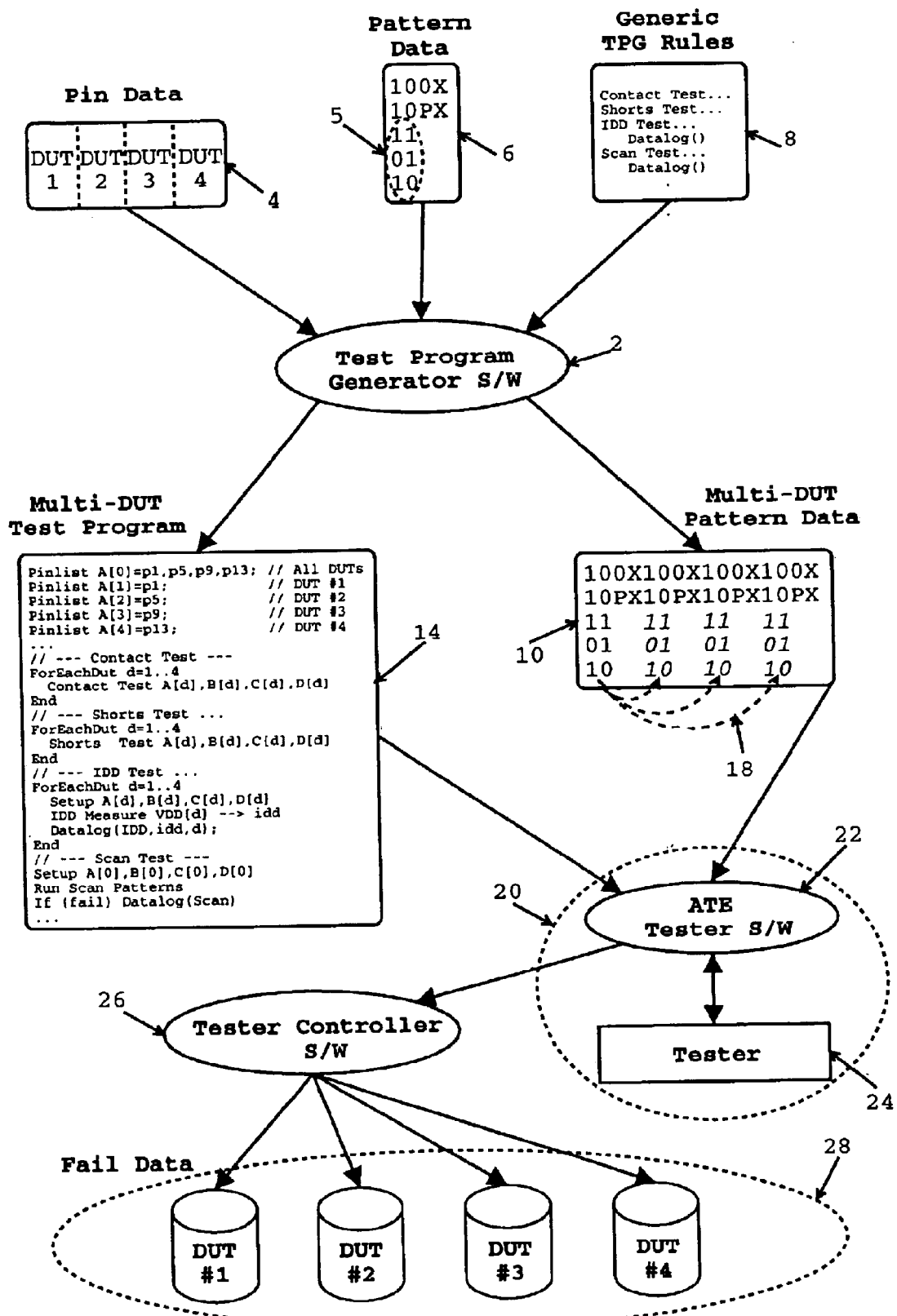

AUTOMATED MULTI-DEVICE TEST PROCESS AND SYSTEM

BACKGROUND OF THE INVENTION

In today's microelectronics test environment, there is always increasing focus on reducing test time and cost as well as increasing throughput at both the wafer level and module level test. One of the areas of test that has recently become more popular in addressing these concerns is that of testing multiple devices in parallel (hereinafter referred to as "multi-DUT testing"). The idea with multi-DUT testing is that during the test for a single device, the tester you are using may have unused pins just sitting there idle. With multi-DUT testing these unused pins are programmed to test one or more identical devices in parallel with the original device being tested. Multi-DUT testing can drastically reduce test time and cost, while significantly increasing throughput of the existing installed tester base.

This is all well and good, but multi-DUT testing is not without problems. Many challenges exist in implementing multi-DUT testing for a particular device into a manufacturing environment. Below is a list of the challenges involved:

1. Generating a multi-DUT program is an error prone, manually intensive and time consuming task which generally can be justified only for high volume parts.
2. Fairly complex issues arise for multi-DUT testing with regards to test execution flow and datalogging.
3. Generally, automated test equipment (hereinafter referred to as "ATE") vendors do not provide multi-DUT hardware or software support. The ones that do, many times impose various limitations with their solution which prevent their support from being a viable alternative. Limitations include such things as restricting pin allocations for each of the multiple devices to certain banks of pins. Also, limitations on the structure of the tests, serial or parallel execution of tests, as well as robust test program flow can severely hinder the use of an ATE solution. In the "real world" of test, flexibility and tester programmability are extremely important.

As a result of these problems, multi-DUT cannot be realized in many cases due to the cost of implementation as well as restrictions imposed by the ATE hardware/software. Hence, the need for this invention.

SUMMARY OF THE INVENTION

This invention is a methodology for incorporating multi-DUT test program generation, execution, and datalogging into a manufacturing environment. An object of this invention is to have little or no impact to the surrounding processes and data flow in that environment.

The invention includes an automated process from generation of the test program to datalogging it of the test results for multi-DUT. This provides the structure required to realize multi-DUT test in a more pervasive way than in the past. This helps eliminate errors and noticeably reduces the development time of implementing multi-DUT for a particular device.

The invention builds the multi-DUT test program, pattern, and datalogging outside the domain of the ATE tester hardware and software. This allows for multi-DUT testing to be implemented on virtually any tester whether or not that tester provides any kind of multi-DUT support. This alleviates many restrictions imposed by ATE software and hardware.

The invention provides total flexibility of multi-DUT pin allocations across the available tester pin set. This alleviates wiring constraint problems in designing front end hardware DIBs for a given device. This allows for maximum utilization of tester pins to test the most DUTs possible.

The invention accomplishes this by providing a method for automatically generating a test environment for testing a plurality of DUTs in a test system, comprising the steps of: mapping the plurality of DUTs into pins of the tester system to create pin data; inputting into a test program generator pattern data, generic test program rules and the pin data; generating a multi-DUT test program and multi-DUT pattern data; and controlling the test system through the test program.

BRIEF DESCRIPTION OF THE DRAWINGS

FIG. 1 is a flow diagram depicting the system environment and process used by this invention

DETAILED DESCRIPTION OF THE INVENTION

FIG. 1 is a flow diagram depicting the system environment and process used by this invention. An important piece of the invention is that the multi-DUT test program and patterns are generated automatically. An automated approach provides the structure required to integrate all the components of this process. The software to provide this automation is called the Test Program Generator and is shown as block 2 in FIG. 1. The Test Program Generator takes as input: Pin Data 4, Pattern Data 6, and Generic Test Program Generator Rules 8. These inputs are stored in storage areas accessible to the Test Program Generator 2.

Pin Data 4 is the only data in this process that contains the definition of the total number of devices under test (hereinafter referred to as "DUTs") to be tested as well the product pin to tester pin mappings for each of the DUTs. Pin Data 4 must be developed for each device for which multi-DUT test needs to be implemented. In the case of FIG. 1, there are four DUTs. There is no restriction on which product pin maps to which tester pin in the test system 20. This allows the front end hardware designer flexibility in the wiring layout of the device interface board which is used in the tester. Also, this allows for maximum utilization of tester pins. The Test Program Generator software uses the DUT definitions and pin mappings in the Pin Data to automatically generate all pin declarations and pinlists in the final test program. By default each pinlist is written out in parallel form. Additionally, within the TPG rules a test engineer can optionally specify a serial pinlist output into the test program. When accessing the pinlist using this form, all the pins across all the DUTs are accessed for the list of pins specified. For instance, if we had a pinlist which was to access all output pins then the parallel form of this pinlist would access all output pins on all DUTs. The second form is a serial version of the pinlists. Accessing the serial versions of pinlists will access only the requested DUT's pins for that pinlist. Having both single and parallel versions of the pinlists provides the necessary building blocks for total flexibility in designing each test within the full test program. It allows tests to be constructed to access each of the DUTs in parallel, serially, or a mix of both.

Table 1 below illustrates the mapping for a sample of signal pins for the case where two devices are under test.

TABLE 1

```
// File:       Pin Data
// Description: Pin Data maps chip pad to tester channel
//
// ===============================================/
//|     CHANNEL| CHANNEL| CHIP PAD |
// ===============================================/
    FIELDS=CHANNEL,    CHANNEL,     CHIP_PAD,
           005,        006,         AW15,
           007,        008,         AQ21,
           009,        010,         AJ23,
           011,        012,         AA15,
           015,        016,         AS23,
           019,        020,         AC07,
           021,        022,         AU01,
```

As illustrated in Table 1 there are two devices, each one with its own set of "channels". One DUT has odd number channels, the second DUT the even number channels. CHIP_PAD is the pin on the DUT that correlates to the pins in the pattern data.

Pattern Data 6 is an additional input to the Test Program Generator. The Pattern Data describes the various pattern vectors and scan patterns 5 to be applied to the DUT. Using Pin Data, the Test Program Generator 2 replicates the Pattern Data for each of the DUT definitions and pin mappings. This results in pattern data coming out of the Test Program Generator which win apply pattern vectors to all DUTs in parallel as illustrated in block 10. Many ATE testers provide pattern memory on a per-pin basis. For this type of pattern memory it is not a problem replicating the pattern data for each of the specified DUT's because this would not decrease the total vector depth of the tool. In addition, some ATE testers provide vector memory which is managed separately from any specific pin vector memory.

For example, in scan-based testing, a separate scan memory may be provided by the ATE. Many times, this memories' depth is dependent upon it's configured width. It would be very prohibitive to replicate the scan pattern data thereby decreasing the total scan vector depth. In this case, the Test Program Generator software must not replicate the scan pattern data but rather enable the sharing of the first DUT's scan pattern data out to all the other DUT's for optimum tester resource utilization.

Table 2 below is pseudo code illustrating how to scan pattern data is shared in an Advantest Tester.

TABLE 2

```
//*************************************************
//** SCAN CLASS
//*************************************************
class SCAN {
private:
    MW         pds
    int        scpgPatA (0x61940000)
```

TABLE 2-continued

```
    int             scpgPatB (0x61944000)
    Array<int>      scanPinIndex [numDUTs]
    Array<int>      scanPins[numDUTs] [numScanPins]
public:
    void setScanPin(int pin, ...) {
        for (int i=0; i<numPins; i++) {
            scanPins[i] [scanPinIndex[i]++] = pin;
        }
    }
    void loadScanPins( ) {
        for (int i=0; i<numScanPins; i++) {
            for (int j=1; j<numDUTs; j++) {
    pds.Set (scpgPatA + ((scanPins[j,i]–1)*4),
    pds.Gen(scpgPatA+((scanPins[0,i]–1)*4)));
    pds.Set (scpgPatB + ((scanPins[j,i]–1)*4),
    pds.Gen(scpgPatB+((scanPins[0,i]–1)*4)));
            }
        }
    }
}; // end SCAN
SCAN scan;
scan.setScanPin(15,16);   // DUT1 channel 15, DUT2 channel 16
scan.setScanPin(5,6);     // DUT1 channel 5,  DUT2 channel 6
scan.setScanPin(9,10);    // DUT1 channel 9,  DUT2 channel 10
scan.setScanPin(19,20);   // DUTI channel 19, DUT2 channel 20
scan.setScanPin(11,12);   // DUT1 channel 11, DUT2 channel 12
scan.setScanPin(21,22);   // DUT1 channel 21, DUT2 channel 22
```

The table again is describing the situation where two DUTs are under test, DUT1 and DUT2. Fundamentally, it is creating a mapping of parallel pins to their counterparts on DUT1. If you had a DUT 3 you would simply be adding the corresponding channel in DUT3 to the list.

Generic Test Program Generator Rules 8 are used to describe the structure of each of the tests to be applied, the integration of the Pattern Data, the datalogging to be done for each test, and the flow control of the entire test program. What the Generic Test Program Generator Rules do not contain, is any "hard-coded" test constructs specific to a particular device. Rather, they are a device-independent description of the test program. The generic nature of these rules describing the test program allows for a single set of rules to be developed and used for an entire technology or family of devices.

These Generic Test Program Generator Rules 8 enable the multi-DUT testing of this invention. The necessary constructs are embedded in the rules to address the various issues with regards to multi-DUT testing. For instance, these rules contain the description of each individual test to be applied to the device. Within these defined tests, the application of the test is done by interfacing to the multiple devices in either a parallel or serial manner. This is done on a test-by-test basis.

Table 3 below describes the rules in code form that enable Multi-DUT testing.

TABLE 3

```
//----------------------------------------------------------------
// Function to declare some simple pingroups required for setups
//----------------------------------------------------------------
void pingroups( ) {
    $PINGROUP {var=inPins;     arg=PINUSE(I);          }
    $PINGROUP {var=outPins;    arg=PINUSE(O,OH);       }
    $PINGROUP {var=clkPins;    arg=CLKTYPE(A,B,BC,C);  }
```

TABLE 3-continued

```
        // Pingroup dimensioned by DUT to enable serial testing
        $PINGROUP {var=contactPins;  arg=PINUSE;   dim=BYDUT; }
} // end pingroups( )
//-------------------------------------------------------------------------------
// Function to implement contact test (serial)
//-------------------------------------------------------------------------------
void contact (INLEVELS icorner, TIMINGS tcorner) {
        $WRITE { fid=TPP; }
        setupParametricVoltageMeasurement( );
FOR_EACH_SITE
        // Define pins to be measured
        measureVm.pinlist (contactPins [CTE_currentsite]);
        // Setup pins to be measured
        setupPins (contactPins[CTE_currentsite],icorner,tcorner)
        // Execute test
        measureVm.Exec ( );
        if (getResult( ) == FAIL) {
             sortData.set (CTE_head, CTE_currentsite, CTE_category);
             LOG_M_PIN_ISVM(measureVm,measureVmLimits,contactPins[CTE_currentsite]);
        }
END_EACH_SITE
        $ENDWRITE
} // end contact( )
//-------------------------------------------------------------------------------
// Function to implement functional test (parallel)
//-------------------------------------------------------------------------------
void func_test(INLEVELS icorner, OUTLEVELS ocorner, TIMINGS tcorner) {
        $WRITE { fid=TPP; }
        setupPowerSupplies ( );
        setupPins (inPins, icorner,tcorner);
        setupPins (outPins, ocorner, tcorner);
        scan.loadScanPins( ); // load shared scan
        MEASLPAT.Exec( ); // execute test
        if(getResult( ) == FAIL) {
            DataLog.getFailSites (MEASLPAT);
            sortData.setFailSites (CTE_head, CTE_category);
            log_Functional (MEASLPAT);
        }
} // end func_test(in_corner,out_corner,tim_corner)
//-------------------------------------------------------------------------------
// PNPmain function
//-------------------------------------------------------------------------------
void   PNPmain( ) {
        pingroups( );              // setup pinlists
        //-------------------------------------------------------------------------------
        // Test: Contact
        //-------------------------------------------------------------------------------
        $MTAS { id=contact;   desc=MDC Contact;       category=VOLT1; }
             contact( );
        $ENDMTAS
        //-------------------------------------------------------------------------------
        // Test: Functional (nominal)
        //-------------------------------------------------------------------------------
        $MTAS { id=func_nom; desc=functional (nominal); category=FUNCSECTION; }
             $TEST { patset=func; patopts=opts_dbm;
             test=func_test{I_NOM,O_NOM,T_NOM);
}
        $ENDMTAS
        //-------------------------------------------------------------------------------
        // RUN TIME TAS DEFINITIONS
        //-------------------------------------------------------------------------------
        $RTASDEF(name=CNTC; desc=CONTACT TAS;)
             $RTAS(id=contact;    sone=1;   emode=BYTEST;      dmode=FAILS; }
        $ENDRTASDEF
        $RTASDEF(name=ENG; desc=ENGINEERING TAS;}
             $RTAS {id=contact;   sone=1;   emode=BYDEVICE;  dmode=NONE; }
             $RTAS{id=func0_nom;    sone=1;      emode=BYDEVICE;     dmode=NONE, }
        $ ENDRTAS DEF
        #include "ctewin" // tester controller software
}// end PNPmain
```

The generic rules provide for a setup function for the pin groups, for serial testing and parallel testing, as well as some general rules.

These Generic Test Program Generator Rules 8 are read in by the Test Program Generator software 2 (which is C++ code) along with the device-specific Pin Data 4 and Pattern Data 6. The is resulting output is a device-specific Multi-DUT Test Program 14 and Pattern Data 10. Built into the Multi-DUT Test Program 14 is the flow control which was specified in the Generic Test Program Generator Rules 8 but with the hooks into the Tester Controller software to coordinate the complexities of flow control related to testing multiple devices at the same time.

Table 4 below includes the output control flow mechanism. This illustrates how it is used to control the tester 20 which is comprised of tester software 22 and hardware 24. The specific Multi-DUT Test Program is being applied to the two DUTs shown in Table 1 to illustrate how Pin Data 4 and Generic Test Program Generator Rules 8 are used.

TABLE 4

```
//---------------------------------------------------------
//    Pinlist definitions
//---------------------------------------------------------
ARRAY<PINLIST>ALLPINS(3) ; // Required for datalogging
ALLPINS[0].define(P005, P006, P007, P008, P009, P010, P011, P012, P015, P016,
                  P019, P020, P021, P022);
ALLPINS[1].define(P005, P007, P009, P011, P015, P019, P021);
ALLPINS[2].define(P006, P008, P010, P012, P016, P020, P022);
ARRAY<PINLIST>ALLPINS_XREF(3) ; // Required for datalogging
ALLPINS_XREF[0].define(P005, P005, P007, P007, P009, P009, P011, P011, P015,
P015, P019, P019, P021, P021);
ALLPINS_XREF[1].define(P005, P007, P009, P011, P015, P019, P021);
ALLPINS_XREF[2].define(P005, P007, P009, P011, P015, P019, P021);
PINLIST clkPins.define(P007,P008);
PINLIST inPins.define(P005,P006,P007,P008,P009,P010,P015,P016);
PINLIST outPins.define(P011,P012,P019,P020,P021,P022);
ARRAY<PINLIST>contactPins(3);
contactPins[0].define(P005,P006,P007,P008,P009,P010,P011,P012,P015,P016,P019,
P020,P021,P022);
contactPins[1].define(P005,P007,P009,P011,P015,P019,P021);
contactPins[2].define(P006,P008,P010,P012,P016,P020,P022);
//---------------------------------------------------------
//    Contact test (serial implementation)
//---------------------------------------------------------
int contact(INLEVELS icorner, TIMINGS tcorner) {
    setupParametricVoltageMeasurement ( );
    for (CTE_currentsite=1; CTE_currentsite<MAX_SITES; CTE_currentsite++) {
        if (activeSites.getSiteStatus(0,CTE_currentsite)) {
            // Define pins to be measured
            measureVm.pinlist(contactPins[CTE_currentsite]);
            // Setup pins to be measured
            setupPins(contactPins[CTE_currentsite],icorner,tcorner)
            // Execute test
            measureVm.Exec( );
            if (getResult( ) == FAIL) {
                sortData.set (CTE_head, CTE_currentsite, CTE_category);
    TDS_rc=dataLog.logMPinISVM(measureVm,measureVmLimits,contactPins[CTE_currentsite]);
            }
        }
        return TDS_rc;
    }
}
p_contact.Set(contact);
//---------------------------------------------------------
// Functional test (parallel implementation)
//---------------------------------------------------------
int func_nom(INLEVELS icorner, OUTLEVELS ocorner, TIMINGS tcorner) {
    setupPowerSupplies ( );
    setupPins (icorner,ocorner,tcorner);
    scan.loadScanPins( );    // load shared scan
    MEASLPAT.Exec( );        // execute test
    if(getResult( ) == FAIL) {
        dataLog.getFailSites (MEASLPAT);
        sortData.setFailSites (CTE_head, CTE_category);
        datalog.logFunctional(MEASLPAT);
    }
    return TDS_rc;
}
p_func_nom.Set(func_nom);
//***********************************************************
//** Test Definitions
//***********************************************************
TDS_mtas.add(0,p_contact,"contact",0,VOLT1);
TDS_mtas.add(1,p_func_nom, "func_nom",1,FUNCSECTION);
//***********************************************************
```

TABLE 4-continued

```
//** Test Sequence Definitions
//*********************************************************
TDS_RTAS CNTC;
CNTC.add("contact",1,dmode_FAILS, emode_BYTEST);    // MDC Contact
TDS_RTAS ENG;
ENG.add("contact",1,dmode NONE,emode_BYDEVICE);     // MDC Contact
ENG.add("func_nom",1,dmode_NONE,emode_BYDEVICE);    // functional (nominal)
void main( ) {
    switch (jobRunStatus) {
        case eENGINEERING_MODE:
            dataLog.setEngMasks(CTE_head0,3);   // Set bit mask of sites to test
            ENG.exec( );                        // Execute ENG test sequence
            break;
        case eCONTACT_TEST:
            dataLog.setEngMasks(CTE_head0,3);   // Set bit mask of sites to test
            CNTC.exec( );                       // Execute CNTC test sequence
            break;
    }
} //end of main
```

As is illustrated in Table 4, the Multi-DUT Test Program provides the specific implementation for actual DUTs that are tested together. These include the actual pin lists, parallel and serial tests. Note that the tests by default are run in parallel on all devices. Under test circumstances where current limitations exist or for certain measurements the test will run serially by looping through the then active DUTs or as identified in the Multi-DUT Test Program, the "activeSite" under test.

Also, the resulting Multi-DUT Test Program 14 contains calls to Tester Controller software 26 to datalog test results. A key point to make here is that the Multi-DUT Test Program 14 and Pattern Data 10 appear to ATE Tester hardware and software system 20 as a simple single-DUT test. All the multi-DUT controls are provided outside of the ATE environment.

Tester Controller software 26 runs in conjunction with the executing Multi-DUT Test Program 14 to apply the requested test program flow control and datalogging of results. For flow control, flags are used to indicate active and inactive DUTs. These flags are used by the Multi-DUT Test Program to determine which test to run next as well as if any inactive DUTs need to be masked out. For datalogging, the Tester Controller software accepts datalog calls from the executing Multi-DUT Test Program. It then takes the datalog results for all DUTs and splits it out into individual DUT datalog results shown as 28 in FIG. 1. Pin data logged for DUT's 2, 3 and 4 are normalized back to the associated DUT 1 pins to preserve fail data relative to Dut 1. Producing individual DUT datalog results completes the multi-DUT testing flow and from that point on in the manufacturing environment the data is applied in a normal fashion.

The following is some sample code, that shows how the invention logs functional fails for each DUT. There are three pieces of code, the first one, Table 5, is the log functional call, the second, Table 6 shows how fail sites are obtained, and the third, Table 7, shows how failing pins are assigned to the DUT.

Below is some sample code of the log functional call:

TABLE 5

```
int sampleLogFunctional( )
{
----Setup DFM and execute your measure 1pat----
if FAIL==????)
{
    dataLog.getFailSites(MEASLPAT);
    sortData.setFailSites(CTE_head0,CTE_category);
    if((TDS_rc = dataLog.logFunctional(MEASLPAT)) ==-1) {return
TDS_rc,}
    }
}
returnTDS_rc;
}
```

The getFailSites is how the invention determine which sites had fails and use data for sorting (binning) before collecting the fails for data logging. The ALLPINS array holds the all the pins in the first element. Site one pins are held in the second element, index of 1, and so on for each site. Table 6 below is some sample code for determining which sites had fails from an Advantest tester:

TABLE 6

```
void getFailSites(MEASURE_FT & ftname)
{
    int num_of_1pins=0;
    int templpin;
    //*********************************************************
    // Set the failSites to zero
    //*********************************************************
    failSites.setSiteMask(CTE_head0,0);
    //*********************************************************
    //Loop thru pins to catch fails
    //*********************************************************
    for (int site = 1; site <MAX_SITES; site++)
    {
        if (1 == activeSites.getSiteStatus(CTE_head0,site))
        {
            num_of_1pins = ALLPINS[site].length( );
            for(int pin = 1; pin <= num_of_1pins; pin++)
            {
                templpin = ALLPINS[site].define_read(pin)&0xffff;
                DUMMY.define(templpin,1);
                if(1 == ftname.Get_Pinresuit(1,DUMMY))
                {
                    failSites.setSite(CTE_head0,site);
                    break;
                }
            }
        }
```

TABLE 6-continued

```
            }
        }
    }
    return;
}
```

The following sample code from logFunctional, shows where we determine the DUT for a failing pin while we are collecting results for data logging:

TABLE 7

```
//***********************************************************
// Only use sites that are active and have failed
//***********************************************************
for (site=1; site<=MAX_SITES; site++)
{
    if((1 == activeSites.getSiteStatus(CTE_head0,site)) &&
        (1 == failSites.getSiteStatus(CTE_head0,site)))
    {
        num_of_1pins=ALLPINS[site].length( );
        for (pinresi=1; pinresi<=num_of_1pins; pinresi++)
        {
            logpin= ALLPINS[site].define_read(pinresi)&0xffff;
            xrefpin=ALLPINS_XREF[site].define_read(pinresi)&0xffff;
            DUMMY.define(logpin,1);
            Pinresult=ftname.Get_Pinfail(1,faili,DUMMY);
...code left out here...
```

In the foregoing detailed description, the system and method of the present invention has been described with reference to specific exemplary embodiments thereof. However, it will be evident that various modifications and changes may be made thereto without departing from the broader spirit and scope of the present invention. The specification, figures, and tables are accordingly regarded as illustrative rather than restrictive.

What is claimed is:

1. A method of testing multiple integrated circuits simultaneously, the method comprising the steps of:

executing a tester controller program residing in an Automatic Test Equipment (ATE), the tester controller program and ATE having a design intended to test one integrated circuit at a time; and executing a multi-test program, residing external to the ATE, in conjunction with the tester controller program so that the ATE can test multiple integrated circuits simultaneously.

2. The method of claim 1 further comprising the step of:

creating a multi-test program from generic rules that describe the structure of each of the tests to be applied to each of the integrated circuits, the structure having a description that is independent from any of the integrated circuits.

3. The method of claim 2 wherein the step of creating includes the step of:

creating the multi-test program from pattern data that describes pattern vectors and scan patterns for each of the integrated circuits.

4. The method of claim 3 wherein the step of creating includes the step of:

creating the multi-test program from pin data that describes the ATE pin mappings for each one of the integrated circuits.

5. An apparatus for testing multiple integrated circuits simultaneously, the apparatus comprising:

an Automatic Test Equipment (ATE) having a tester controller program residing therein, the ATE and tester controller program having a design intended to test one integrated circuit at a time; and a computer, external to the ATM, for executing a multi-test program in conjunction with the tester controller program so that the ATE can test multiple integrated circuits simultaneously.

6. The apparatus of claim 5 further wherein the computer further comprises:

hardware for creating a multi-test program from generic rules that describe the structure of each of the tests to be applied to each of the integrated circuits, the structure having a description that is independent from any of the integrated circuits.

7. The apparatus of claim 6 wherein the hardware includes:

hardware for creating the multi-test program from pattern data that describes pattern vectors and scan patterns for each of the integrated circuits.

8. The apparatus of claim 7 the hardware includes:

hardware for creating the multi-test program from pin data that describes the ATE pin mappings for each one of the integrated circuits.

9. An apparatus for testing multiple integrated circuits simultaneously, the apparatus comprising:

means for executing a tester controller program residing in an Automatic Test Equipment (ATE), the tester controller program and ATE having a design intended to test one integrated circuit at a time; and means for executing a multi-test presiding external to the ATE, in conjunction with the tester controller program so that the ATE can test multiple integrated circuits simultaneously.

10. The apparatus of claim 9 further comprising:

means for creating a multi-test program from generic rules that describe the structure of each of the tests to be applied to each of the integrated circuits, the structure having a description that is independent from any of the integrated circuits.

11. The apparatus of claim 10 herein the means for creating includes:

means for creating the multi-test program from pattern data that describes pattern vectors and scan patterns for each of the integrated circuits.

12. The apparatus of claim 11 wherein the means for crating includes:

means for creating the multi-test program from pin data that describes the ATE pin mappings for each one of the integrated circuits.

* * * * *